US012685070B2

(12) United States Patent
Yan et al.

(10) Patent No.: US 12,685,070 B2
(45) Date of Patent: Jul. 14, 2026

(54) INTEGRATED DIE EJECTOR FOR DIE ATTACH EJECTOR DEVICES

(71) Applicant: Western Digital Technologies, Inc., San Jose, CA (US)

(72) Inventors: Simon Yan, Shanghai (CN); JianHua Wang, Shanghai (CN); Kaijian Shi, Shanghai (CN); Bin Liu, Shanghai (CN); Zhonghua Qian, Shanghai (CN); Jim Zhang, Shanghai (CN); Joyce Chen, Taichung (CN); Juan Zhou, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 214 days.

(21) Appl. No.: 18/364,685

(22) Filed: Aug. 3, 2023

(65) Prior Publication Data

US 2024/0312808 A1 Sep. 19, 2024

Related U.S. Application Data

(60) Provisional application No. 63/490,665, filed on Mar. 16, 2023.

(51) Int. Cl.
*H10P 72/00* (2026.01)
(52) U.S. Cl.
CPC ................................ *H10P 72/0442* (2026.01)

(58) Field of Classification Search
CPC ..... H01L 21/67132; H01L 2221/68318; H01L 2221/68322; H01L 2221/68381; B32B 43/006; H10P 72/0442; H10P 72/7412; H10P 72/7414; H10P 72/744
See application file for complete search history.

(56) References Cited

U.S. PATENT DOCUMENTS 4,166,716 A * 9/1979 DeSantis ............. B29C 66/1122
425/406
2014/0251760 A1* 9/2014 Amin ................ H01L 21/68778
198/477.1

FOREIGN PATENT DOCUMENTS

JP H0625964 Y2 * 7/1994
KR 20220006828 A * 1/2022

* cited by examiner

*Primary Examiner* — George R Koch
(74) *Attorney, Agent, or Firm* — Morgan, Lewis & Bockius LLP

(57) ABSTRACT

An integrated die ejector for separating a die from a wafer, the die ejector includes an ejector mechanism that includes an ejector pin. There is an ejector base coupled to the ejector pin and configured to couple the integrated die ejector to a die attach ejector machine. There is a pepper pot at least partially surrounding the ejector mechanism and ejector base and a sleeve coupled thereto and positioned between the ejector mechanism and pepper pot. The sleeve and pepper pot define an upper and lower motion limit of the ejector base and retain the ejector mechanism within the pepper pot such that the integrated die ejector may be coupled to and decoupled from the die attach ejector machine as a single unit to reduce installation time.

18 Claims, 6 Drawing Sheets

108

134

126b

122

124c

106

C

INTEGRATED DIE EJECTOR FOR DIE ATTACH EJECTOR DEVICES

CROSS-REFERENCE TO RELATED APPLICATIONS

This application claims the benefit of U.S. Provisional Patent Application No. 63/490,665 filed Mar. 16, 2023 entitled "Integrated Die Ejector for Die Attach Ejector Devices", which is incorporated by reference herein in its entirety.

BACKGROUND

The present disclosure generally relates to die attach ejector systems and devices and, more particularly, to an integrated die ejector of a die attach ejector device for separating semiconductor dies from a wafer and transferring the die to a substrate.

During assembly of semiconductor device packages, die attach ejector devices are commonly used to separate semiconductor dies from a wafer or adhesive strip and transfer the separated semiconductor dies to a substrate (e.g., a printed circuit board (PCB)) to be included in a semiconductor device package. Die attach (DA) ejector devices commonly include a die ejector positioned below the wafer and a plunger positioned above the wafer. When separating the die from the wafer, the die ejector applies an upward force on the wafer, via a pin or needle, below where a die is positioned to create a slight step difference in the die relative to other dies on the wafer. This causes the bottom surface of the die to be partially decoupled from the wafer such that the plunger may apply an upward vacuum force on the die to easily separate the die from the wafer and transfer the die to a substrate. Die ejectors are commonly coupled to a drive mechanism of the DA ejector device that drives the movement of the pin or needle.

After repeated use, die ejectors may become worn or deformed and require replacement. However, conventional die ejectors require a multi-step process in order to be attached to the drive mechanism. For example, a base component may be coupled to the drive mechanism, an ejector mechanism may then be coupled to the base component and then an outer housing surrounding the ejector mechanism (also known as a "pepper pot") may be coupled to the ejector mechanism and/or base. As such, this process is often time consuming and during this process the DA ejector device cannot be used to decouple dies from a wafer. Furthermore, in order for the die ejector to function properly when attached to the drive mechanism, the components of the die ejector must be properly aligned with one another. As such, achieving proper alignment may take multiple attempts and is dependent upon the skill level of a personnel attaching the die ejector, component by component, to the drive mechanism. In instances where a proper alignment is not initially achieved, the components must be disassembled and re-installed in accordance with the above outlined process. For example, the pepper pot must be decoupled first, then the ejector mechanism, and then the base component. This may further increase the downtime of the DA ejector device and often leads increases the risk of damaging the pin and/or needle of the ejector mechanism. Therefore, there is a need to provide an integrated die ejector configured to be decoupled from the DA ejector device without decoupling the ejector mechanism and ejector base from the pepper pot.

SUMMARY

In one embodiment there is an integrated die ejector for separating a die from a wafer, the die ejector including an ejector mechanism including an ejector pin translatable along a central axis, an ejector base coupled to the ejector pin and translatable along the central axis, the ejector base configured to couple the integrated die ejector to a die attach ejector machine, a pepper pot at least partially surrounding the ejector mechanism and ejector base, a sleeve coupled to the pepper pot and positioned between the ejector mechanism and pepper pot, the pin and ejector base are translatable along the central axis relative to the pepper pot, and the sleeve and pepper pot retain the ejector base within the pepper pot and restrict translation of the ejector base along the central axis between an upper and lower motion limit.

In some embodiments, the pepper pot includes first, second, and third inner side walls each having a different radius, a first stepped surface at an interface of the first and second inner side walls, and a second stepped surface at an interface of the second and third inner side walls. In some embodiments, the third inner side wall of the pepper pot includes one or more channels extending downwardly from the second stepped surface towards a bottom surface of the pepper pot. In some embodiments, the sleeve includes a lip that abuts the first inner side wall and first stepped surface of the pepper pot and a shaft extending downwardly therefrom between the first stepped surface and second stepped surface, the shaft defining a bottom surface of the sleeve.

In some embodiments, the ejector base includes one or more engagement arms fixedly coupled to the ejector base, each of the one or more engagement arms moveable along a respective one of the one or more channels of the pepper pot between a lower surface of the one or more channels and the bottom surface of the sleeve. In some embodiments, the base includes four engagement arms radially offset from one another and the pepper pot includes four channels radially offset from one another. In some embodiments, a radius of the first inner side wall is greater than a radius of the second inner side wall and the radius of the second inner side wall is greater than a radius of the third inner side wall. In some embodiments, each of the one or more channels extend downwardly from the second stepped surface by a distance less than a length of the third inner side wall of the pepper pot. In some embodiments, the ejector base includes a magnetic coupling element configured to provide a downward force for retaining a connection between the ejector base and lock cap. In some embodiments, an inner sidewall of the sleeve is treated with a self-lubricating material. In some embodiments, the integrated die ejector is configured to be decoupled from the die attach ejector machine without decoupling the ejector mechanism and ejector base from the pepper pot.

In another embodiment there is an integrated die ejector for separating a die from a wafer, the die ejector including a pepper pot including a first stepped surface, a second stepped surface, and one or more channels extending downwardly from the second stepped surface towards a bottom surface of the pepper pot, an ejector mechanism positioned within the pepper pot and including an ejector pin translatable along a central axis relative to the pepper pot, a sleeve positioned within the pepper pot between the ejector mechanism and pepper pot, the sleeve including an upper portion that abuts the first stepped surface and a lower portion extending downwardly therefrom towards the second stepped surface, the lower portion defining a bottom surface of the sleeve, and an ejector base coupled to the ejector pin and translatable along the central axis relative to the pepper pot, the ejector base configured to couple the integrated die ejector to a die attach ejector machine, the ejector base including one or more engagement arms each positioned within a corresponding one of the one or more channels of the pepper pot. The bottom surface of the sleeve and the one or more channels of the pepper pot retain the ejector base within the pepper pot and restrict translation of the ejector base along the central axis between an upper and lower motion limit.

In some embodiments, the base includes four engagement arms radially offset from one another and the pepper pot includes four channels radially offset from one another. In some embodiments, each of the one or more channels do not extend to a bottom surface of the pepper pot. In some embodiments, the ejector base includes a magnetic biasing element configured to provide a downward force for retaining a connection between the ejector base and a lock cap of the die attach ejector machine. In some embodiments, an inner sidewall of the sleeve comprises a self-lubricating material. In some embodiments, the integrated die ejector is configured to be decoupled from the die attach ejector machine without decoupling the ejector mechanism and ejector base from the pepper pot.

In another embodiment there is a die attach ejector machine for separating a die from a wafer, the die attach ejector machine includes an integrated die ejector including, an ejector mechanism including an ejector pin translatable along a central axis, an ejector base coupled to the ejector pin and translatable along the central axis with the ejector pin, the ejector base including one or more engagement arms radially spaced from one another and fixedly coupled to the ejector base, a pepper pot at least partially surrounding the ejector mechanism and ejector base, the pepper pot including first, second, and third inner side walls each having a different radius, a first stepped surface at an interface of the first and second inner side walls, and a second stepped surface at an interface of the second and third inner side walls, the third inner side wall of the pepper pot including one or more channels radially spaced from one another and extending downwardly from the second stepped surface towards a bottom surface of the pepper pot, and a sleeve coupled to the pepper pot and positioned between the ejector mechanism, the sleeve including an upper portion including a lip that abuts the first inner side wall and first stepped surface of the pepper pot and a lower portion extending downwardly therefrom between the first stepped surface and second stepped surface, the lower portion defining a bottom surface of the sleeve. There may be a lock cap coupled to the ejector base and configured to cause the ejector base to translate along the central axis. Each of the one or more engagement arms are moveable along a respective one of the one or more channels of the pepper pot between a lower surface of the one or more channels and the bottom surface of the sleeve and the integrated die ejector is configured to be decoupled from the die attach ejector machine without decoupling the ejector mechanism and ejector base from the pepper pot.

In some embodiments, the ejector base includes a magnetic biasing element configured to provide a downward force for retaining a connection between the ejector base and the lock cap. In some embodiments, an inner sidewall of the sleeve comprises a self-lubricating material.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments, which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Numerous details are described herein in order to provide a thorough understanding of the example embodiments illustrated in the accompanying drawings. However, some embodiments may be practiced without any of the specific details, and the scope of the claims is only limited by those features and aspects specifically recited in the claims. Furthermore, well-known methods, components, and circuits have not be described in exhaustive detail so as not to unnecessarily obscure pertinent aspects of the embodiments described herein.

Figure 1:
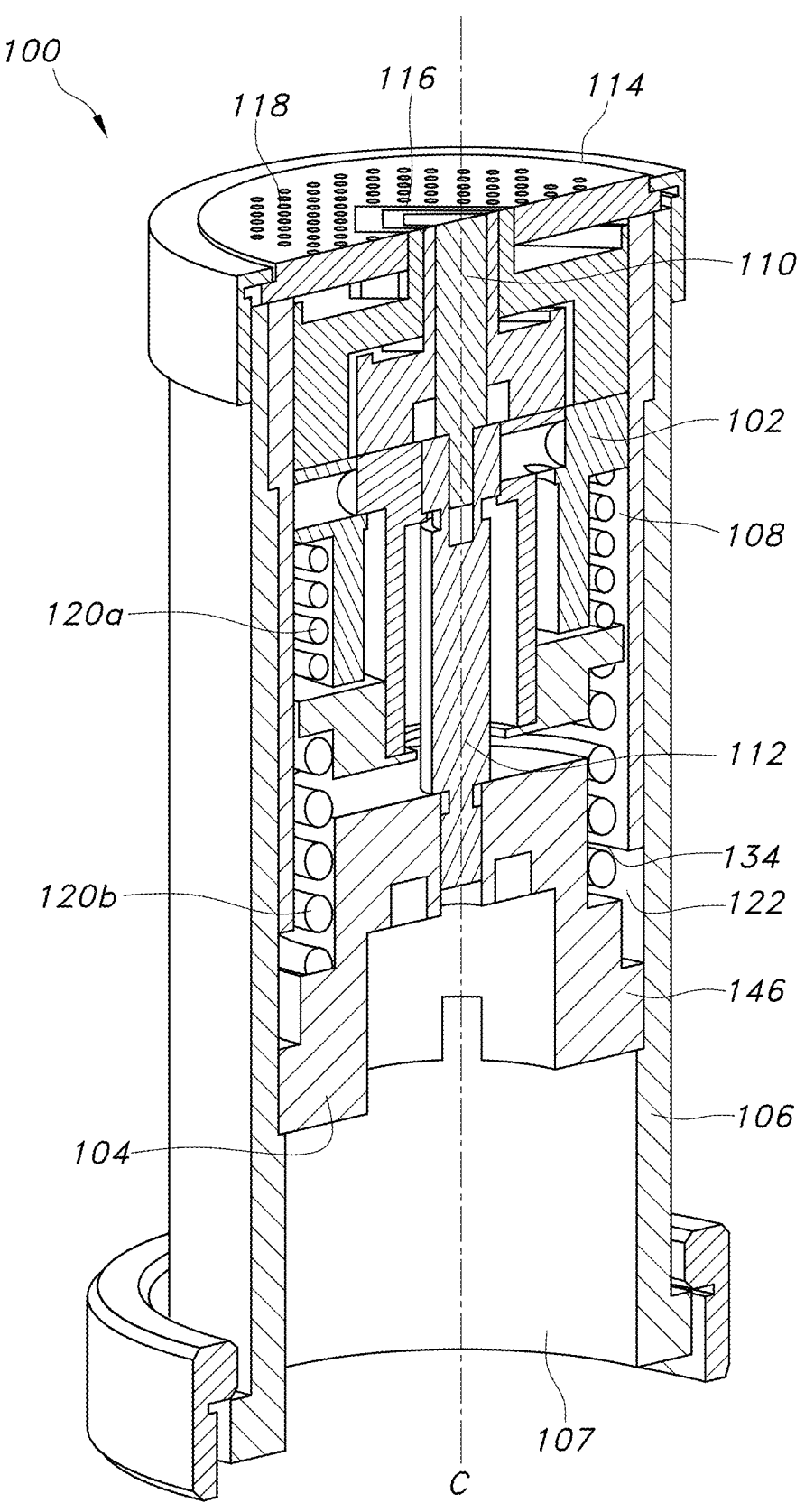
FIG. 1 is a cross-sectional perspective view of an integrated die ejector in accordance with an exemplary embodiment of the present disclosure, the remaining portion of the integrated die ejector may be a mirror image thereof.

Referring to FIG. 1, there is shown a cross-sectional view of an integrated die ejector, generally designated 100 and referred to as die ejector 100 for short, in accordance with an exemplary embodiment of the present disclosure. The die ejector 100 may be configured to be coupled to a DA ejector machine, system and/or device. In some embodiments, the die ejector 100 of the present disclosure 100 is configured to be coupled and/or decoupled from an existing DA ejector machine without requiring disassembly of one or more components included in the die ejector 100. For example, the die ejector 100 may be configured to be coupled and decoupled from a DA ejector machine as a single unit rather than be disassembled and reassembled as required by conventional die ejectors.

The die ejector 100 may be configured to be attached to the drive mechanism of a DA ejector system that is configured to remove a semiconductor die from a wafer mounting tape, and pick and place the semiconductor die on a substrate (e.g., a PCB) to be included in a semiconductor device package. A wafer, as referenced herein may refer to a thin layer (e.g., between about 275 micrometers to about 925 micrometers) of a semiconductor material (e.g., a crystalline silicon) that is used in the fabrication of, for example, integrated circuits, and/or photovoltaics. The wafer may undergo a wafer dicing process in which a series of cuts are made on the a surface of the wafer thereby forming a plurality of semiconductor dies coupled to a wafer carrier layer (e.g., via an adhesive). A semiconductor die, or die for short, may refer to a block of semiconducting material on which a functional circuit may be fabricated. Some examples of semiconductor dies may include, but are not limited to, integrated circuit dies, memory dies (e.g., NAND or flash memory dies). In some embodiments, the integrated die ejector 100 of the present disclosure is configured to, when coupled to the DA ejector machine, be positioned below the wafer carrier and, when actuated, provide an upward force on a die to loosen the die from the wafer carrier such that a plunger positioned above the die may easily remove the die from the wafer carrier.

The die ejector 100 may include an ejector mechanism 102, an ejector base 104, a pepper pot 106, and a sleeve 108. The ejector mechanism 102, ejector base 104 and/or sleeve 108 may be positioned within the housing ("pepper pot") 106. In some embodiments, the pepper pot 106 at least partially surrounds the ejector mechanism 102, ejector base 104, and/or sleeve 108. For example, the pepper pot 106 may entirely encircle the ejector mechanism 102, ejector base 104, and/or sleeve 108 while providing an opening at the bottom surface 107 of the pepper pot 106 such that the integrated die ejector 100 may be easily coupled to and/or decoupled from a DA ejector machine. In some embodiments, the sleeve 108 may be coupled to the pepper pot 106 and positioned between the ejector mechanism 102 and pepper pot 106. In some embodiments, the base 104 may be configured to couple the integrated die ejector 100 to the DA ejector machine. For example, and as discussed in further detail below, the base 104 may be configured to be directly coupled to a drive mechanism of a DA ejector machine (not shown) thereby coupling the die ejector 100 to the DA ejector machine. In some embodiments, the opening in the bottom surface 107 of the pepper pot 106 is sized and configured to receive a portion of the DA ejector machine that engages with base 104.

In some embodiments, the ejector mechanism 102 is configured to, when the die ejector 100 is coupled to a DA ejector machine, exert an upward force on a wafer carrier and/or die coupled thereto. For example, the ejector mechanism 102 may include an ejector pin 110 translatable along a central axis C relative to the pepper pot 106 and configured to exert an upward force on a wafer carrier and/or die coupled thereto when the die ejector 100 is coupled to a DA ejector machine. In some embodiments, one or more other components of the ejector mechanism 102 may be translatable along a central axis C relative to the pepper pot 106. In some embodiments, the pin 110 may be translatable along the central axis C while one or more other components of the ejector mechanism 102 remain substantially stationary.

In some embodiments, the ejector base 104 is coupled to the ejector pin 110 and is translatable along the central axis C. The ejector base 104 may be configured to cause the ejector pin 110 to translate along the central axis C. In some embodiments, the ejector base 104 may be coupled to the ejector pin 110 by a linkage arm 112 such that translation of the ejector base 104 along the central axis C may cause the ejector pin 110 to translate along the central axis C. In some embodiments, the ejector base 104 and the ejector pin 110 are fixedly coupled to the linkage arm 112.

In some embodiments, the ejector pin 110 is configured to translate relative to the pepper pot 106 along the central axis C such that in an extended position (not shown) the pin 110 extends outwardly from the pepper pot 106. The pepper pot 106 may include a cap 114 at the top surface of the pepper pot 106 including a pin aperture 116 and a plurality of vacuum apertures 118. The pin aperture 116 may be sized and/or shaped to allow the pin 110 to pass freely therethrough. For example, and as shown in FIG. 1, the pin aperture 116 has generally the same shape as the pin 110 and has a larger footprint than the pin 110 to allow the pin 110 to pass freely therethrough when translating between a non-extended position and an extended position. The pin 110 when in the non-extended position (e.g., as shown in FIG. 1) may be positioned at least partially within the pin aperture 116. The vacuum apertures 118 may be configured to allow for a downward vacuum force (e.g., a force directed toward the bottom surface 107 of the pepper pot 106) to be applied to a wafer carrier as the pin 110 translates from the non-extended position to the extended position.

The die ejector 100 may include one or more biasing elements configured to bias the ejector pin 110 toward a non-extended position, as shown in FIG. 1. In some embodiments, the die ejector 100 includes an upper biasing element 120a and a lower biasing element 120b configured to bias the ejector pin 110 toward the non-extended position. For example, during translation from the non-extended position toward the extended position the ejector pin 110 may translate upwardly along the central axis C toward the cap 114 causing the upper and/or lower biasing elements 120a, 120b to exert a downward force directed away from the cap 114 on the ejector pin 110. In this manner, following translation from the non-extended position to the extended position the upper and/or lower biasing elements 120a, 120b may exert a downward force on the ejector pin 110 causing the ejector pin to translate from the extended position back to the non-extended position. In some embodiments, the upper and lower biasing elements 120a, 120b are springs (e.g., compression springs). In some embodiments, the lower biasing element 120b has a greater spring rate than the upper biasing element 120a.

Figure 2:
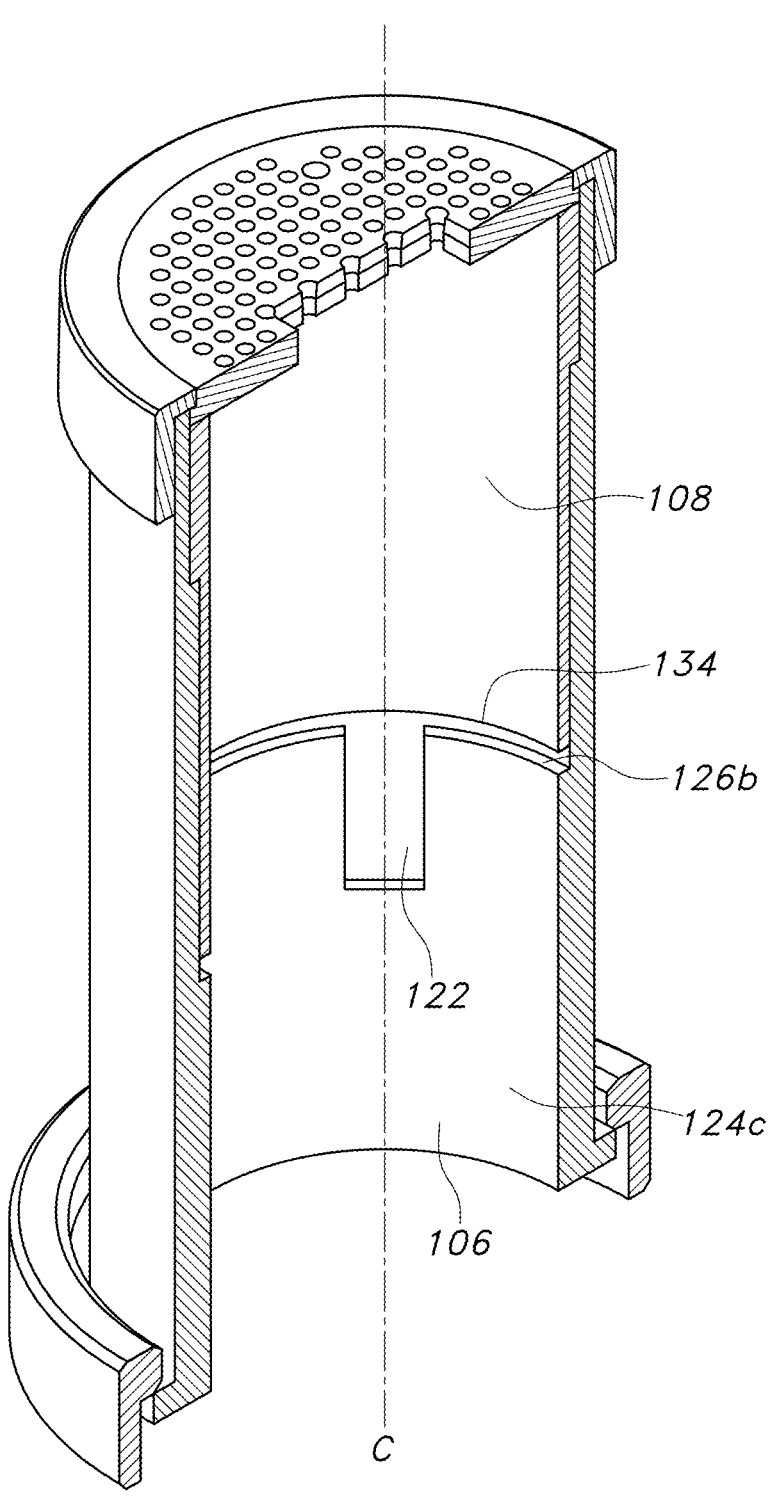
FIG. 2 is a cross-sectional perspective view of the pepper pot, sleeve and cap of the integrated die ejector of FIG. 1 coupled together, the remaining portion may be a mirror image thereof.
Figure 3:
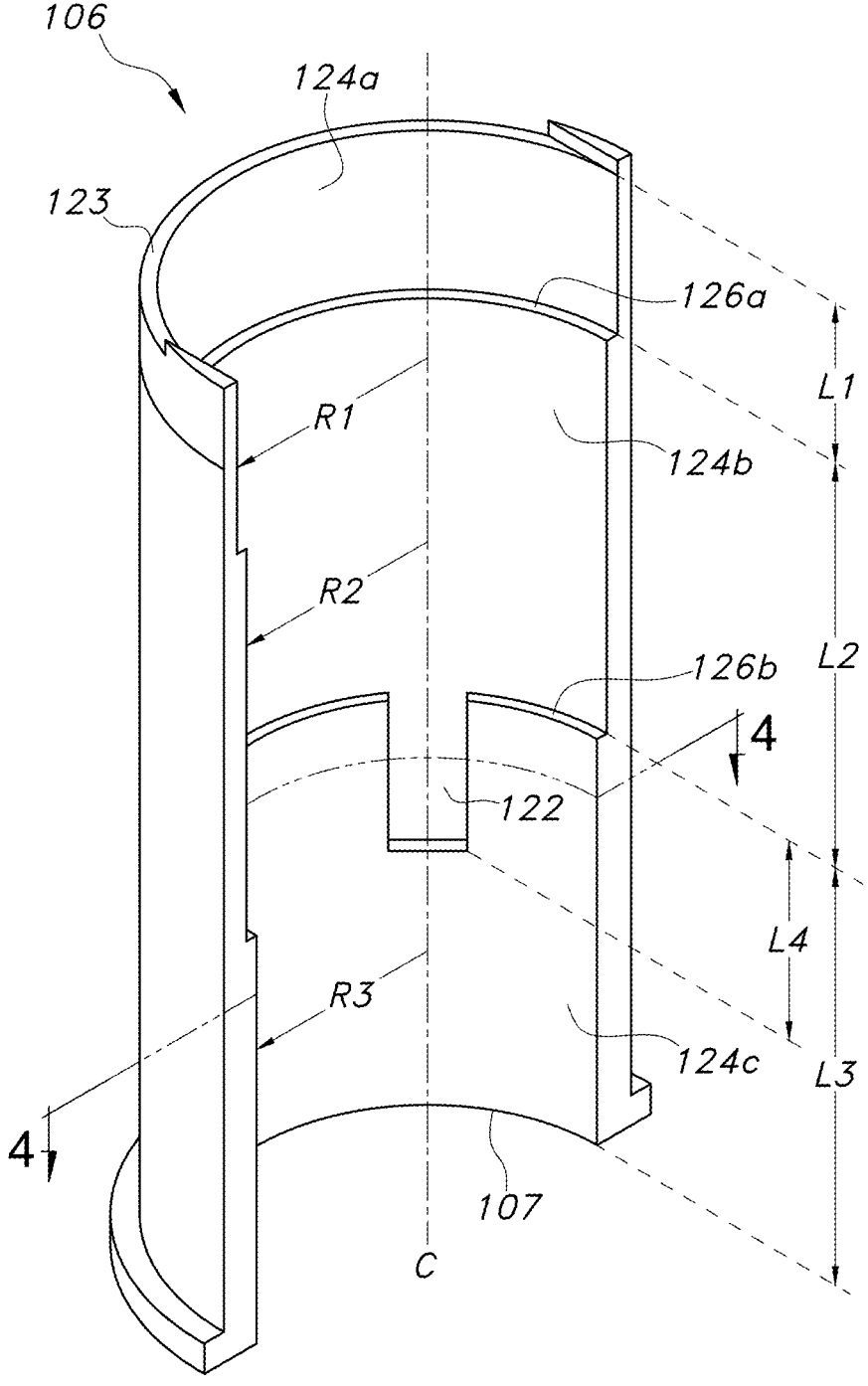
FIG. 3 is a cross-sectional perspective view of the pepper pot of the integrated die ejector of FIG. 1, the remaining portion may be a mirror image thereof.

Referring to FIGS. 2-3, the pepper pot 106 may have a generally tubular configuration and include a plurality of sections along central axis C, the sections having inner walls with different inside diameters or radii. Each section may have a different length. In some embodiments, the pepper pot 106 may include one or more inner side walls each having a different inside radius than one another and a stepped surface at the interface between adjacent inner side walls. In some embodiments, the pepper pot 106 includes a first inner side wall 124a, a second inner side wall 124b, and a third inner side wall 124c. There may be a first stepped surface 126a at an interface of the first and second inner side walls 124a-124b and a second stepped surface 126b at an interface of the second and third inner side walls 124b-124c. Each of the inner side walls 124a-124c may extend circumferentially around the central axis C. For example, each of the inner side walls 124a-124c may have corresponding radii R1-R3 that are not equal. In some embodiments, the radius R1 of the first inner side wall 124a is greater than the radius R2 of the second inner side wall 124b. In some embodiments, the radius R2 of the second inner side wall 124b is greater than the radius R3 of the third inner side wall 124c. In some embodiments, the radius R1 is about 13.75 mm, the radius R2 is about 13.00 mm and the radius R3 is about 12.50 mm. In some embodiments, the radius R1 is greater than the radius R2 by between about 2.5% to about 5%. In some embodiments, the radius R2 is greater than the radius R3 by between about 2.5% to about 5%.

The first inner side wall 124a may extend downwardly from a top surface 123 by a length L1 to the first stepped surface 126a. In some embodiments, the length L1 may be between about 8.00 mm to about 14.00 mm. In some embodiments, the length L1 is about 11.00 mm. The second inner side wall 124b may extend downwardly from the first stepped surface 126a by a length L2 to the second stepped surface. In some embodiments, the length L2 is between about 20.00 mm to about 30.00 mm. In some embodiments, the length L2 is about 25.00 mm. The third inner side wall 125c may extend downwardly from the second stepped surface 126b by a length L3 to the bottom surface 107 of the pepper pot 106. In some embodiments, the length L3 is between about 20.00 mm to about 30 mm. In some embodiments, the length L3 is about 26.00 mm. In some embodiments, the length L1 may be less than the length L2 and/or length L3. In some embodiments, the length L1 is about 50% of the length L2 and/or L3. In some embodiments, the length L2 is less than or equal to the length L3. In other embodiments, the length L2 is greater than or equal to the length L3.

Figure 4:
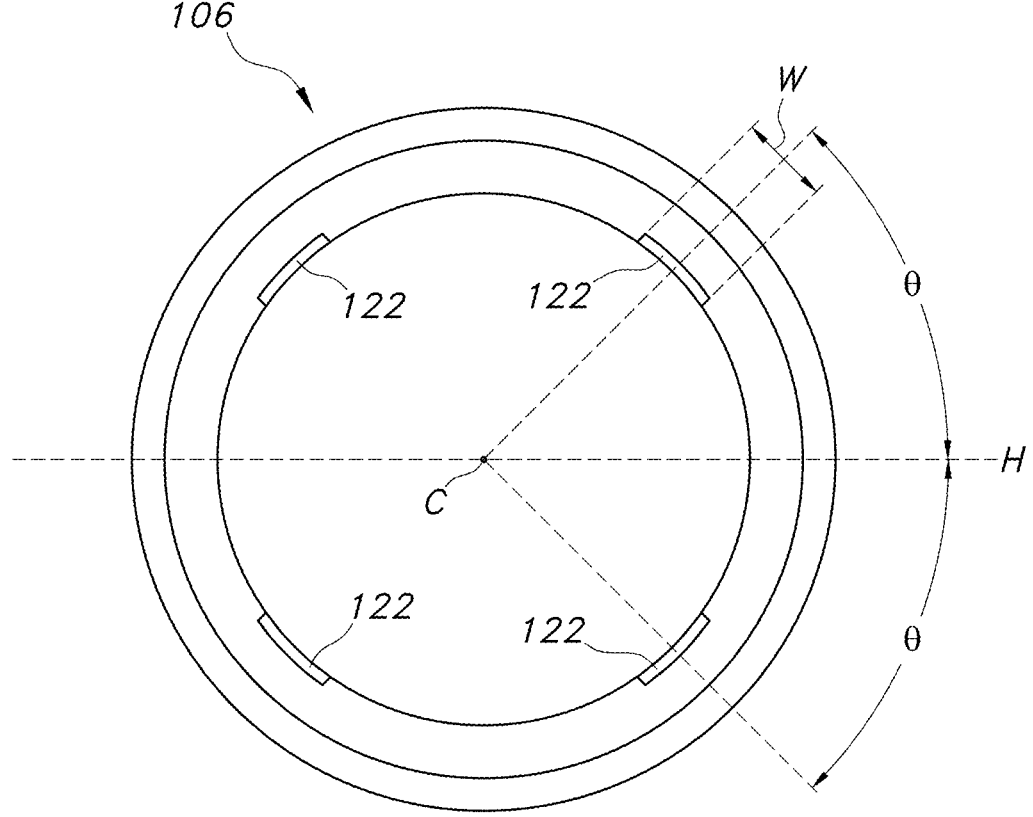
FIG. 4 is a top cross-sectional view of the pepper pot shown in FIG. 3 taken along the line 4-4 in the direction of the arrows.
Figure 5A:
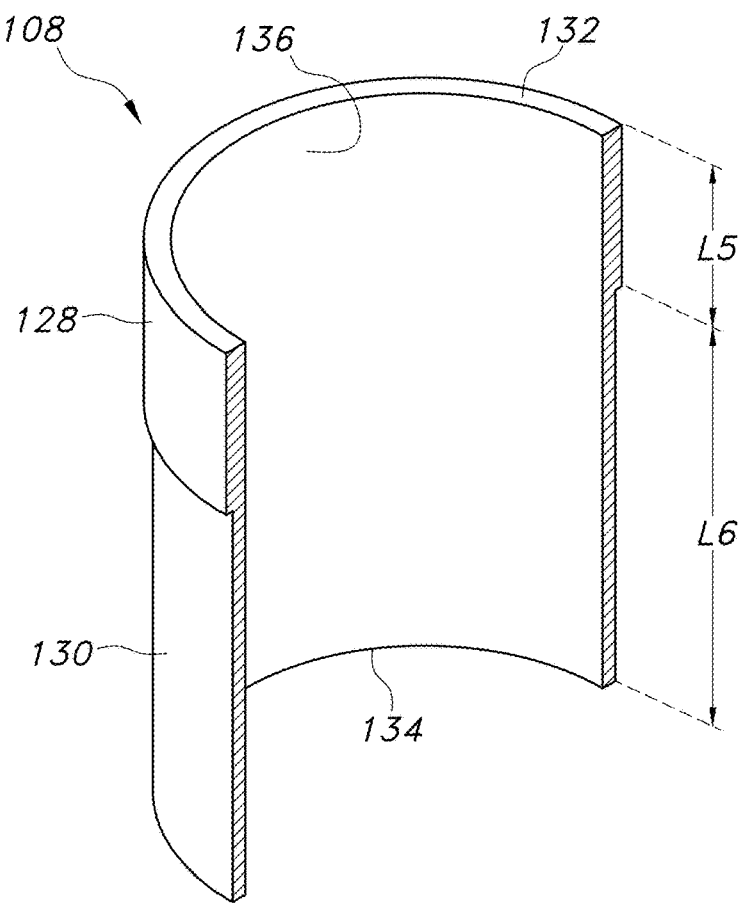
FIG. 5A is a cross-sectional perspective view of the sleeve of the integrated die ejector of FIG. 1, the remaining portion may be a mirror image thereof.
Figure 5B:
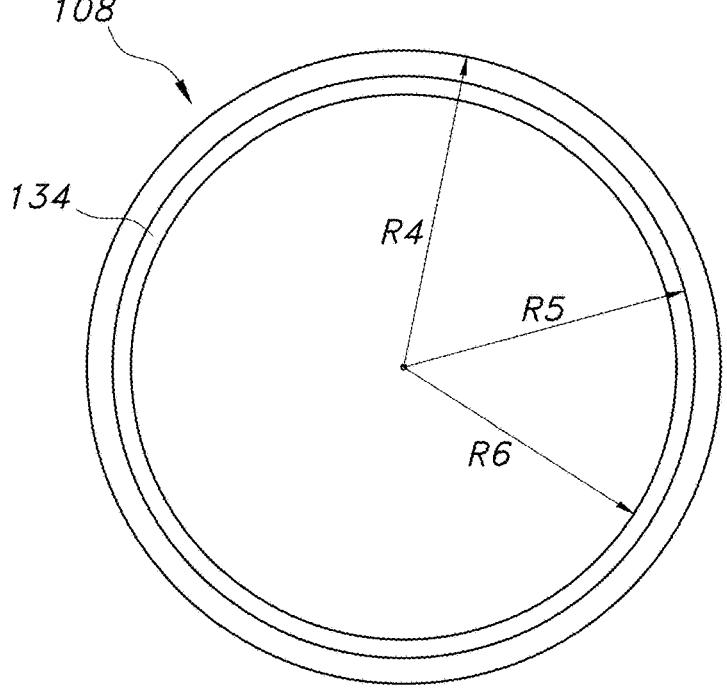
FIG. 5B is a bottom view of the sleeve of the integrated die ejector of FIG. 1.

Referring to FIGS. 3-4, the pepper pot 106 may include one or more channels 122 configured to receive corresponding engagement features (e.g., engagement arms, protrusions) of the base 104, as discussed in more detail below. The channels 122 may extend downwardly from the second stepped surface 126b along the third inner side wall 124c towards the bottom surface 107 of the pepper pot 106. In some embodiments, the channels 122 extend partially along the third inner side wall 124c. In this manner, the channels 122 may not be open at the bottom surface 107 of the pepper pot 106 such that the engagement features of the ejector base 104 may be prevented from translating below the bottom surface 107. For example, each channel 122 may be open at the second stepped surface 126b and may extend downwardly therefrom by a length L4 that is less than the length L3 of the third inner side wall 124c. In some embodiments, the length L4 is between about 20% to about 40% of the length L3. In some embodiments, the length L4 is between about 5.00 mm to about 15.00 mm. In some embodiments, the length L4 is about 9.10 mm.

In some embodiments, each channel 122 has a width W that is generally equal. In some embodiments, the width W is about 4.00 mm. In other embodiments, one or more channels 122 may have a different width than another channel 122. In some embodiments, at least one surface of the channels 122 is generally flush with the second inner side wall 124b. For example, and as shown FIG. 3, the inner surface of the channel 122 is generally flush with the second inner sidewall 124b. In some embodiments, the pepper pot 106 includes at least four channels 122 each radially offset from one another. For example, the pepper pot 106 may include four channels 122 each radially offset from a horizontal axis H that intersects the central axis C and is perpendicular thereto by an angle Θ. As such, each channel 122 may be offset from one another by twice the angle Θ (2Θ). In some embodiments, the angle Θ is equal to about three-hundred and sixty divided by twice the number of channels 122. For example, if there are four channels then the angle Θ is equal to about 45°. In some embodiments, the pepper pot 106 is integrally formed. In some embodiments, the pepper pot 106 is comprised of a metal or metal alloy (e.g., stainless steel).

Referring to FIGS. 2-3 and 5A-5B, the sleeve 108 may be configured to couple to the pepper pot 106 proximate the top surface 107. The sleeve 108 may include a lip 128 and a shaft 130 extending downwardly therefrom. The lip 128 may extend downwardly from a top surface 132 of the sleeve 108 to the shaft 130. The shaft 130 may extend downwardly from the lip 128 to the bottom surface 134 of the sleeve 108. The lip 128 may be configured to couple to the pepper pot 106 at the first inner side wall 124a and first stepped surface 126a. For example, the lip 128 may, when coupled to the pepper pot 106, abut the first inner side wall 124a and/or the first stepped surface 126a. As such, the lip 128 may have an outer radius R4 that is generally equal to the radius R1 of the first inner side wall 124a. In some embodiments the outer radius R4 is less than the radius R1 and greater than the radius R2 of the second inner side wall 124b. In this manner, the lip 128 may rest on the first stepped surface 126a. In some embodiments, the lip 128 is sized to be interference fit or pressed fit with the first inner side wall 124a and/or first stepped surface 126a.

The shaft 130 may have an outer radius R5 that is less than or equal to the radius R2 of the second inner sidewall 126. In some embodiments, the shaft 130 is sized to be clearance fit to the pepper pot 106. For example, the outer radius R5 of the shaft 130 may be sized to be clearance fit to the second inner sidewall 126 of the pepper pot 106. The outer radius R5 may be less than the outer radius R4 of the lip 128. In some embodiments, the lip 128 and shaft 130 have generally the same inner radius R6. In some embodiments, the inner radius R6 is less than or equal to the radius R3 of the third inner sidewall 126c of the pepper pot 106. In some embodiments, the inner radius R6 is greater than the radius R3 and less than the radius R2. In some embodiments, the inner radius R6 is about 24.00 mm.

In some embodiments, the sleeve 108 is configured to abut the first stepped surface 126a and not the second stepped surface 126b when coupled to the pepper pot 106. The lip 128 may extend downwardly by a length L5 from the top surface 132 of the sleeve 108 and the shaft 130 may extend downwardly from the lip 128 by a length L6. In some embodiments, the lengths L5+L6 are less than or equal to the lengths L1+L2 of the pepper pot 106. In this manner, the bottom surface 134 of the sleeve 108 may be positioned above the second stepped surface 126b when the sleeve 108 is coupled to the pepper pot 106, as shown in FIG. 2. In some embodiments, the length L5 may be about 10.00 mm and the length L6 may be about 23.50 mm. In other embodiments, the bottom surface 134 of the sleeve 108 is configured to abut the second stepped surface 126b of the pepper pot 106. In use, ejector mechanism 102 may slide against the inside surface of sleeve 108 as ejector mechanism 102 translates along central axis C. In some embodiments, the inner surface 136 of the sleeve 108 is made from or treated with a self-lubricating material to reduce friction between the inner surface 136 of the sleeve 108 with the ejector mechanism 102. In some embodiments, the sleeve 108 is comprised of a metal or metal alloy (e.g., stainless steel, steel).

In some embodiments, the sleeve 108 may be treated using a nitriding process. For example, the sleeve 108 may be at least partially treated using a nitriding process to create a case-hardened surface thereby improving surface abrasive resistance of the sleeve 108.

Figure 6:
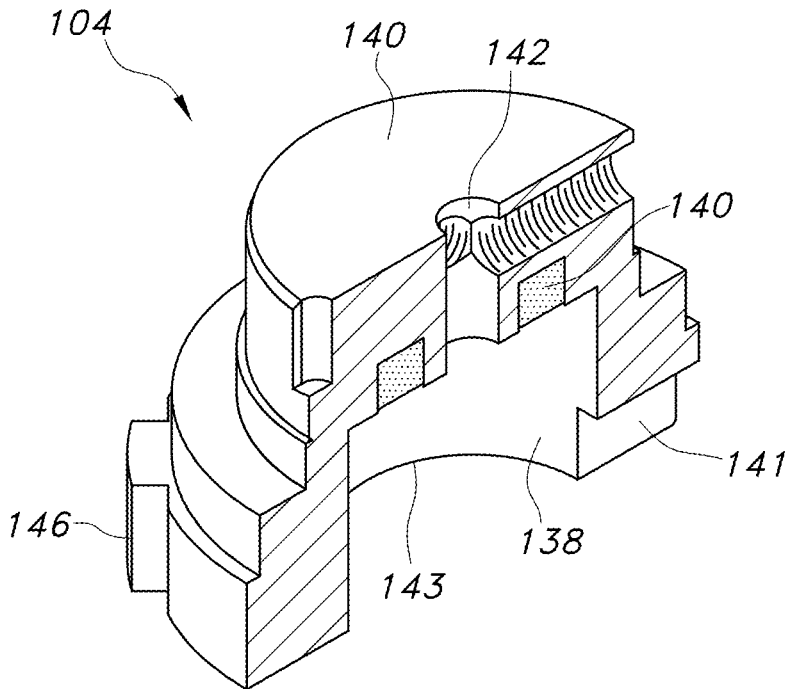
FIG. 6 is a cross-sectional perspective view of the ejector base of the integrated die ejector of FIG. 1; the remaining portion may be a mirror image thereof.
Figure 7:
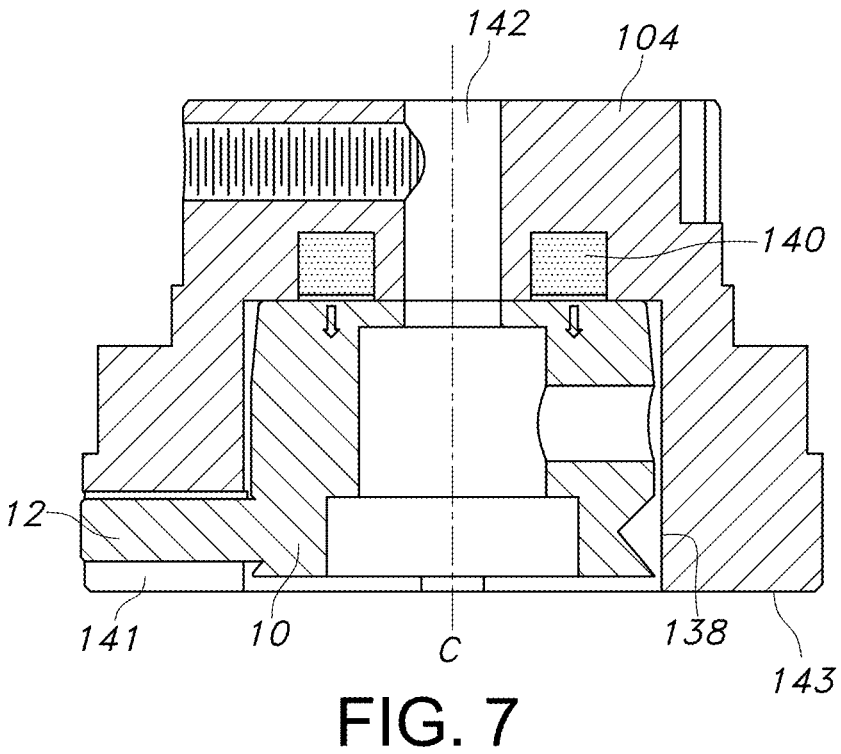
FIG. 7 is a cross-sectional view of the ejector base of the integrated die ejector of FIG. 1, coupled to a lock cap of a die ejector machine.

Referring to FIGS. 6-7, the ejector base 104 may be configured to couple the integrated die ejector 100 to a DA ejector machine. For example, the ejector base 104 may be configured to be coupled to a lock cap 10 of an existing DA ejector machine. The ejector base 104 may include a lock cap aperture 138 configured to receive the lock cap 10 therein. In some embodiments, the lock cap aperture 138 is open at a bottom surface 143 of the ejector base 104 to allow the lock cap 10 to pass therethrough and abut an upper surface of the lock cap aperture 138. The lock cap aperture 138 may be sized and/or shaped to correspond to the size and/or shape of the lock cap 10. In some embodiments, the ejector base 104 may include a coupling element 140 configured to provide a downward force (as illustrated by the arrows in FIG. 7) for retaining a connection between the ejector base 104 and lock cap 10. In some embodiments, the coupling element 140 is a magnetic coupling element. The coupling element 140 may be a ring magnet configured to provide a downward force such that the connection or coupling of the lock cap 10 and ejector base 104 are retained. In some embodiments, the magnetic coupling element 140 is fixedly coupled to the ejector base 104 via an interference fit and/or one or more adhesives.

During translation from a resting position to an extended position, the lock cap 10 may translate upwardly thereby causing the base 104 to translate upwardly. When returning from the extended position to the resting position, the lock cap 10 may be caused to translate downwardly by the DA ejector machine. As such, the magnetic coupling element 140 may exert a downward force on the ejector base 104 to cause the ejector base 104 to translate downwardly with the lock cap 10. By providing a magnetic coupling element 140 the DA ejector machine that the base 104 is coupled to may be configured to cause the die ejector 100 to translate between a resting and extended position while minimizing the amount of force required to do so. For example, in conventional die ejectors a biasing element (e.g., typically a conical spring) is used to cause a base or ejector mechanism to return to a resting position from an extended position. As such, during translation from the resting position to the extended position, the DA ejector machine must exert a force great enough to overcome the spring force from the biasing element. However, by providing a magnetic coupling element 140, that spring force of the conventional die ejector is eliminated, thereby reducing the amount of force required to translate the base 104.

In some embodiments, the ejector base 104 may include a radial channel 141 configured to assist a user in properly aligning the ejector base 104 to the lock cap 10. For example, the lock cap 10 may include a radial pin 12 that, when the ejector base 104 and lock cap 10 are correctly aligned, is received within the radial channel 141 (e.g., as illustrated in FIG. 7). During assembly of the die ejector 100 with the ejector machine, a user may align the radial channel 141 with the radial pin 12 and place the die ejector 100 onto the lock cap 10 such that the radial pin 12 is received within the radial channel 141. In some embodiments, the lock cap 10 and/or ejector base 104 may include one or more channels for receiving a fastener for coupling the lock cap 10 to the ejector base 104. For example, a fastener (e.g., a threaded screw or bolt) may be inserted into the channels when the ejector base 104 and lock cap 10 are coupled to one another (e.g., as illustrated in FIG. 7). In other embodiments, the fastener may not be included and a magnetic force exerted by the coupling element 140 may retain the position of the lock cap 10 relative to the ejector base 104 during upward and downward translation of the ejector base 104 along the central axis C.

In some embodiments, the ejector base 104 includes a linkage arm aperture 142 configured to couple the ejector base 104 to the linkage arm 112 of the ejector mechanism 102, as shown in FIG. 1. In some embodiments, the linkage arm 112 of the ejector mechanism 102 may be fixedly coupled to the linkage arm aperture 142 via one or more fasteners. In some embodiments, the linkage arm aperture 142 is configured to allow the linkage arm 112 to pass therethrough and directly couple to the lock cap 10. For example, the linage arm aperture 142 may extend downwardly from a top surface 144 of the ejector base 104 to the lock cap aperture 138 such that the linkage arm 112 may be directly coupled to the lock cap 10.

Referring to FIGS. 1 and 6, in some embodiments, the ejector base 104 includes one or more engagement arms 146 configured to couple the ejector base 104 to the pepper pot 106. For example, the one or more engagement arms 146 may extend outwardly from a periphery of the ejector base 104 and be sized to be received within corresponding channels 122 of the pepper pot 106. In some embodiments, the number of engagement arms 146 may be generally the same as the number of channels 122. For example, if there are four channels 122 radially spaced from one another the ejector base 104 may include four engagement arms 146 radially spaced from one another in generally the same manner. The engagement arms 146 when received within corresponding channels 122 may be prevent the ejector base 104 from rotating relative to the pepper pot 106 while allowing the ejector base 104 to translate along the central axis C. In some embodiments, the engagement arms 146 have generally the same width as the width W of the channels 122. The engagement arms 146 may be fixedly coupled to the ejector base 104 such that translation of the engagement arms 146 along the central axis C causes the ejector base 104 to translate accordingly. In some embodiments, the ejector base 104 and engagement arms 146 are integrally formed. In some embodiments, the ejector base 104 is comprised of a metal or metal alloy (e.g., stainless steel).

In some embodiments, the sleeve 108 and pepper pot 106 may define an upper and lower motion limit of the ejector base 104. When coupled together, the sleeve 108 and pepper pot 106 may be configured to limit translation of the base 104 along the central axis C between a bottom surface 134 of the sleeve 108 and a terminal end (e.g., bottom surface) of the channels 122. Each of the one or more engagement arms 146 may be moveable along a respective channel 122 of the pepper pot 106 between a lower or bottom surface of the channels 122 and the bottom surface 134 of the sleeve 108. For example, and as illustrated in FIG. 1, the engagement arms 146 abut a bottom surface of the respective channels 122 while the ejector base 104 is in a resting, or non-extended, position. During upward translation along the central axis C, the engagement arms 146 may translate upwardly within the respective channels 122 to an extended position in which the engagement arms 146 abut the bottom surface 134 of the sleeve 108. In this manner, the sleeve 108 and pepper pot 106 may be configured to define the upper and lower motion limit of the ejector base 104 and thereby the ejector pin 110.

In some embodiments, and as discussed above, the die ejector 100 is configured to be decoupled from a DA ejector machine without decoupling the ejector mechanism 102, ejector base 104, pepper pet 106, and/or sleeve 108 from one another. The sleeve 108 and ejector base 104 may be configured to retain the ejector mechanism 102 within the pepper pot 106 regardless of whether the die ejector 100 is coupled to or decoupled from a DA ejector machine. For example, when received within the corresponding channels 122, the engagement arms 146 may be retained within the pepper pot 106 via the channels 122 and sleeve 108. As such, the base 104 may be prevented from translating downwardly below the channels 122 and upwardly above the bottom surface 134 of the sleeve 108. Furthermore, the ejector mechanism 102 may be coupled to the ejector base 104 and as such may also be retained within the pepper pot 106 at least in part by the engagement arms 146 of the ejector base 104. In this manner, the ejector mechanism 102 may be connected to the pepper pot 106 via the ejector base 104. As such, the die ejector 100 may be coupled to and decoupled from a DA ejector machine as a single unit rather than requiring assembly and disassembly as required in conventional die ejectors. In this manner, the die ejector 100 of the present disclosure may be configured to reduce the time required to install and/or adjust the die ejector 100 on a DA ejector machine when compared to conventional die ejectors.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one". As used herein, the term "about" may refer to +/−10% of the value referenced. For example, "about 9" is understood to encompass 8.1 and 9.9.

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. An integrated die ejector for separating a die from a wafer, the die ejector comprising:

an ejector mechanism including an ejector pin translatable along a central axis;

an ejector base coupled to the ejector pin and translatable along the central axis, the ejector base configured to couple the integrated die ejector to a die attach ejector machine;

a pepper pot at least partially surrounding the ejector mechanism and the ejector base; and a sleeve coupled to the pepper pot and positioned between the ejector mechanism and the pepper pot, wherein the pin and the ejector base are translatable along the central axis relative to the pepper pot, wherein the sleeve and the pepper pot retain the ejector base within the pepper pot and restrict translation of the ejector base along the central axis between an upper and lower motion limit, wherein the pepper pot includes first, second, and third inner side walls each having a different radius, a first stepped surface at an interface of the first inner side wall and the second inner side wall, and a second stepped surface at an interface of the second inner side wall and the third inner side wall, and wherein the third inner side wall of the pepper pot includes one or more channels extending downwardly from the second stepped surface towards a bottom surface of the pepper pot.

2. The integrated die ejector of claim 1, wherein the sleeve includes a lip that abuts the first inner side wall and the first stepped surface of the pepper pot and a shaft extending downwardly therefrom between the first stepped surface and the second stepped surface, the shaft defining a bottom surface of the sleeve.

3. The integrated die ejector of claim 2, wherein the ejector base includes one or more engagement arms fixedly coupled to the ejector base, each of the one or more engagement arms moveable along a respective one of the one or more channels of the pepper pot between a lower surface of the one or more channels and the bottom surface of the sleeve.

4. The integrated die ejector of claim 3, wherein the one or more engagement arms of the ejector base includes four engagement arms radially offset from one another and the one or more channels of the pepper pot includes four channels radially offset from one another.

5. The integrated die ejector of claim 1, wherein a radius of the first inner side wall is greater than a radius of the second inner side wall and the radius of the second inner side wall is greater than a radius of the third inner side wall.

6. The integrated die ejector of claim 1, wherein each of the one or more channels extend downwardly from the second stepped surface by a distance less than a length of the third inner side wall of the pepper pot.

7. The integrated die ejector of claim 1, wherein the ejector base includes a magnetic coupling element configured to provide a downward force for retaining a connection between the ejector base and a lock cap.

8. The integrated die ejector of claim 1, wherein an inner sidewall of the sleeve is treated with a self-lubricating material.

9. The integrated die ejector of claim 1, wherein the integrated die ejector is configured to be decoupled from the die attach ejector machine without decoupling the ejector mechanism and the ejector base from the pepper pot.

10. An integrated die ejector for separating a die from a wafer, the die ejector comprising:

a pepper pot including a first stepped surface, a second stepped surface, and one or more channels extending downwardly from the second stepped surface towards a bottom surface of the pepper pot;

an ejector mechanism positioned within the pepper pot and including an ejector pin translatable along a central axis relative to the pepper pot;

a sleeve positioned within the pepper pot between the ejector mechanism and the pepper pot, the sleeve including an upper portion that abuts the first stepped surface and a lower portion extending downwardly therefrom towards the second stepped surface, the lower portion defining a bottom surface of the sleeve; and an ejector base coupled to the ejector pin and translatable along the central axis relative to the pepper pot, the ejector base configured to couple the integrated die ejector to a die attach ejector machine, the ejector base including one or more engagement arms each positioned within a corresponding one of the one or more channels of the pepper pot, wherein the bottom surface of the sleeve and the one or more channels of the pepper pot retain the ejector base within the pepper pot and restrict translation of the ejector base along the central axis between an upper and lower motion limit.

11. The integrated die ejector of claim 10, wherein the base includes four engagement arms radially offset from one another and the pepper pot includes four channels radially offset from one another.

12. The integrated die ejector of claim 10, wherein each of the one or more channels do not extend to the bottom surface of the pepper pot.

13. The integrated die ejector of claim 10, wherein the ejector base includes a magnetic biasing element configured to provide a downward force for retaining a connection between the ejector base and a lock cap of the die attach ejector machine.

14. The integrated die ejector of claim 10, wherein an inner sidewall of the sleeve comprises a self-lubricating material.

15. The integrated die ejector of claim 10, wherein the integrated die ejector is configured to be decoupled from the die attach ejector machine without decoupling the ejector mechanism and the ejector base from the pepper pot.

16. A die attach ejector machine for separating a die from a wafer, the die attach ejector machine comprising:

an integrated die ejector comprising:

an ejector mechanism including an ejector pin translatable along a central axis;

an ejector base coupled to the ejector pin and translatable along the central axis with the ejector pin, the ejector base including one or more engagement arms radially spaced from one another and fixedly coupled to the ejector base;

a pepper pot at least partially surrounding the ejector mechanism and the ejector base, the pepper pot including first, second, and third inner side walls each having a different radius, a first stepped surface at an interface of the first and second inner side walls, and a second stepped surface at an interface of the second and third inner side walls, the third inner side wall of the pepper pot including one or more channels radially spaced from one another and extending downwardly from the second stepped surface towards a bottom surface of the pepper pot; and a sleeve coupled to the pepper pot and positioned between the ejector mechanism, the sleeve including an upper portion including a lip that abuts the first inner side wall and the first stepped surface of the pepper pot and a lower portion extending downwardly therefrom between the first stepped surface and the second stepped surface, the lower portion defining a bottom surface of the sleeve; and a lock cap coupled to the ejector base and configured to cause the ejector base to translate along the central axis, wherein each of the one or more engagement arms are moveable along a respective one of the one or more channels of the pepper pot between a lower surface of the one or more channels and the bottom surface of the sleeve, and wherein the integrated die ejector is configured to be decoupled from the die attach ejector machine without decoupling the ejector mechanism and ejector base from the pepper pot.

17. The die attach ejector machine of claim 16, wherein the ejector base includes a magnetic biasing element configured to provide a downward force for retaining a connection between the ejector base and the lock cap.

18. The die attach ejector machine of claim 16, wherein an inner sidewall of the sleeve comprises a self-lubricating material.

* * * * *